United States Patent [19]

Su

[11] Patent Number: 5,013,631

[45] Date of Patent: May 7, 1991

[54] ULTRAVIOLET CURABLE CONFORMAL COATINGS

[75] Inventor: Wei-Fang A. Su, Murrysville Boro, Pa.

[73] Assignee: Westinghouse Electric Corp., Pittsburgh, Pa.

[21] Appl. No.: 318,578

[22] Filed: Mar. 3, 1989

[51] Int. Cl.$^5$ ............................. G03C 1/76; G03F 7/31
[52] U.S. Cl. ........................................ 430/271; 430/280; 430/284; 430/286; 430/288; 430/311; 522/92; 522/174; 522/40; 522/37; 522/33
[58] Field of Search ............... 430/284, 288, 281, 271, 430/311, 286, 280; 522/92, 174

[56] References Cited

U.S. PATENT DOCUMENTS

| | | | |
|---|---|---|---|
| 4,271,258 | 6/1981 | Watariguchi | 430/284 |
| 4,317,858 | 3/1982 | Sattler | 428/379 |
| 4,357,219 | 11/1982 | Sattler | 204/159.15 |
| 4,415,604 | 11/1983 | Nativi | 522/174 |
| 4,424,252 | 1/1984 | Nativi | 428/209 |
| 4,481,258 | 11/1984 | Sattler et al. | 428/371 |
| 4,618,632 | 10/1986 | Su | 522/43 |
| 4,668,713 | 5/1987 | Woods et al. | 522/174 |

Primary Examiner—Marion E. McCamish
Assistant Examiner—Christopher D. RoDee
Attorney, Agent, or Firm—Daniel P. Cillo

[57] ABSTRACT

A two package UV curable conformal coating has been developed which possesses low moisture permeability and good electrical properties and provides a cure for shadowing of components on a printed wiring board. The conformal coating is a mixture of Component (A) which is a mixture of (1) from about 40 to 80% by weight, of a urethane having a free isocyanate group; (2) from about 20 to 60%, by weight, of reactive acrylate diluents; (3) from 0 to about 10% by weight of UV photoinitiators; and (4) from 0 to about 10% by weight of additives; and component (B) which is a mixture of (1) about 50 to 80% by weight of an acrylate-epoxy resin; (2) about 1 to 10% by weight of an acrylate-urethane oligomer; (3) about 10 to 94% by weight of reactive acrylate monomers; (4) from 0 to about 10%, by weight, of UV photoinitiators; and (5) from 0 to about 10% by weight of additives; with the proviso that the total weight percentage of said photoinitiators and additives not be less than 1 percent and not exceed about 10 percent. Components A and B may be mixed in equal parts, by weight, or in a 1 to 2 part ratio, by weight.

41 Claims, No Drawings

ULTRAVIOLET CURABLE CONFORMAL COATINGS

BACKGROUND OF THE INVENTION

1. Field of the Invention

The invention relates to compositions that can be applied to various substrates and cured with ultraviolet (UV) light to form a conformal coating on the substrate, particularly where the substrate is a printed wiring board.

2. The Prior Art

After electronic components have been mounted on printed wiring boards, a conformal coating is usually applied to the boards to protect the components from hostile environments such as high humidity and the presence of corrosive vapors. Conventional solvent-based conformal coating compositions produce coatings having good properties, but the compositions require a long time to dry (at least 5 minutes) at high temperature (usually 150° C. or higher) and harmful solvents are evolved during the curing process. The best conformal coating today is considered to be "Parylene" a trade product of Union Carbide; however, "Parylene" has to be processed by vacuum pyrolysis deposition, a very expensive and patented process.

Conformal coatings that are UV curable have the advantages that they can be cured rapidly (in seconds) with no volatile organic compounds being emitted, so they are well suited for an automated electronic assembly line. However, there is an inadequate cure due to shadowing by the components. U.S. Pat. Nos. 4,424,252 and 4,668,713, for example, disclose a secondary cure mechanism to cure these shadow areas.

In spite of these disclosures, an easily processed solventless, fast curing UV curable conformal coating composition which has the appropriate viscosity, has good shelf life, has low moisture permeability and good electrical properties, and is capable of forming a coating having the required properties including a shadow cure, has not been made.

SUMMARY OF THE INVENTION

The present invention has met the abovedescribed needs by providing an ultraviolet (UV) curable conformal coating possessing good electrical properties, low moisture permeability, good pot life and shadow cure capabilities. The UV curable conformal coating composition of the present invention is preferably applied by spray, dipping, and knife coating on a substrate such as printed wire or circuit boards.

It is an object of the present invention to provide a UV curable conformal coating composition.

It is another object of the present invention to provide a method of making a UV curable conformal coating composition.

It is a further object of the present invention to provide a UV curable conformal coating composition that is capable of a shadow cure.

It is yet another object of the present invention to provide a UV curable conformal coating composition that may be applied to a substrate.

It is an object of the present invention to provide a UV curable conformal coating composition that possesses low moisture permeability, good electrical properties, good pot life and a fast UV cure.

It is another object of the present invention to provide a UV curable conformal coating composition that may be applied in one step.

These and other objects of the present invention will be more fully understood from the following description of the invention.

DETAILED DESCRIPTION OF THE PREFERRED EMBODIMENTS

Ultraviolet radiation curing technology is suited for the manufacturing industry to improve quality, increase productivity, and reduce volatile organic compound emission. Ultraviolet curing may provide high cure speeds and solventless resin systems. Ultraviolet curable resins usually can be cured at high speeds at room temperature on exposure to the appropriate UV wavelength. As a result, there is no damage to heat-sensitive components, and the materials have a long shelf life.

The composition of the present invention is a two-part system and is compatible with in-line assembly. Specifically, the composition has a good adhesion, good electrical insulating properties, low moisture permeability, good thermal stability, and rapid cure times. The composition is particularly suited for curing even of shadow areas, i.e., areas hidden from the UV light source by the presence of electronic components.

The composition of the present invention may be applied by spray, dipping and knife coating, and cured by ultraviolet radiation in a very short time of less than about 2 to 4 seconds. The rapid curing of the composition of the present invention enables its use in automated printed wiring board assembly lines.

The UV curable composition of the present invention is a two package or component system. The first component is a mixture of a urethane having a free isocyanate group in reactive acrylate diluents. The second component contains resin blends of acrylate epoxy and acrylate urethane in reactive acrylate monomers. Photoinitiators and/or additives may be included in either or both components.

More specifically, the UV curable composition is a mixture of Component (A) which is a mixture of (1) about 40 to 80% by weight, of a urethane having a free isocyanate group; (2) about 20 to 60% by weight, of reactive acrylate diluents; (3) from 0 to about 10% by weight of UV photoinitiators; and (4) from 0 to about 10% by weight of additives. Component (A) may optionally contain about 1 to 25% by weight of polyisocyanate monomers.

Component (B) is a mixture of (1) about 5 to 80% by weight of an acrylate-epoxy resin; (2) about 1 to 10% by weight of an acrylate-urethane oligomer; (3) about 10 to 94% by weight of reactive acrylate monomers; (4) from 0 to about 10% by weight of UV photoinitiators; and (5) from 0 to 10% by weight of additives, with the proviso that the total percentage weight of the photoinitiators and additives respectively, each not be less than 1% and not exceed about 10 percent.

Component (B) may optionally contain about 5 to 80% by weight of epoxy resins; about 1 to 10% by weight of polyols; and/or about 5 to 80% by weight of an acrylate epoxy urethane. Each of these components of the composition will now be described in detail.

Component A

(1) Urethane having a free isocyanate group

The urethane may preferably be a urethane or an acrylate urethane. The urethane or acrylate urethane provides flexibility, toughness and hardness.

The urethane is obtained by reacting alcohols or polyols with one stoichiometric equivalent of excess polyisocyanate. The alcohols or polyols may be aliphatic, aromatic or mixtures thereof.

Examples of suitable alcohols include methanol, ethanol, butanol, hexanol, phenol, mixtures thereof and the like. The alcohols having more than four carbons in a straight chain are preferred for flexibility. Examples of suitable low molecular weight polyols are butanediol, hexanediol, ethylene glycol, tetra ethylene glycol, dihydroxy ethyl quinone, glycerin, trimethylolpropane, tris-hydroxy-ethyl isocyanurate, mixtures thereof and the like. The (poly)ethylene glycols are preferred for adhesion. The alcohols or polyols may also possess acrylate functional group for a fast UV cure.

Examples of suitable acrylate alcohols or polyols and more specifically preferred hydroxy acrylates, include 2-hydroxyethyl acrylate (HEA), 3-hydroxypropyl acrylate, 2-hydroxy methacrylate, hydroxyethyl-betacarboxyethyl acrylate, 3-hydroxypropyl methacrylate, hydroxyhexyl acrylate, hydroxyoctyl methacrylate, 2-hydroxypropyl acrylate, and 2-hydroxyethyl methacrylate. Di- and polyacrylates may also be used but they are not preferred as the resulting coatings may be too brittle. The preferred hydroxy acrylate is 2-hydroxyethyl acrylate because it is very reactive and results in a fast curing composition.

Polyisocyanates may be used to produce the free isocyanate group. The polyisocyanate may either di or trifunctional, but diisocyanates are more preferred.

Examples of suitable diisocyanates include:
4,4'-diisocyanato diphenyl 2,2-propane (4,4'-diphenyl-2,2-propane diisocyanate)
4,4'-diisocyanato diphenyl methane (4,4'-diphenylmethane diisocyanate)
20 4,4'-diisocyanato benzidine (4,4'-diphenyl diisocyanate)
4,4'-diisocyanato diphenyl sulfur (4,4'-diphenylsulfide diisocyanate)
4,4'-diisocyanato diphenyl sulfone (4,4'-diphenylsulfone diisocyanate)
4,4'-diisocyanato diphenyl ether (4,4'-diphenylether diisocyanate)
4'-diisocyanato diphenyl 1,1-cyclohexane (4,4'-diphenyl-1,1-cyclohexane diisocyanate)
oxides of methyl- and of bis (meta-isocyanato-phenyl) phosphine(methyl and bis(meta-phenyl isocyanate) phosphine oxide)
diisocyanato 1,5-naphthalene (1,5-naphthalene diisocyanate)
meta-phenylene diisocyanate
tolylene diisocyanate (tolylene diisocyanate or toluene diisocyanate)
3,3'-dimethyl diphenyl 4,4'-diisocyanate (dimethyl 3,3'-diisocyanato 4,4'-diphenylene)
3,3'-dimethoxy diphenyl 4,4'-diisocyanate (dimethoxy 3,3'-diisocyanato 4,4'-diphenylene)
meta-xylylene diisocyanate
para-xylylene diisocyanate
4,4'-dicyclohexylmethane diisocyanate (diisocyanato 4,4'-dicyclohexyl methane)
hexamethylene diisocyanate
dodecamethylene diisocyanate
2,11-dodecane diisocyanate (diisocyanato 2,11-dodecane)
bis(para-phenylene isocyanate 1,3,4-oxadiazole) paraphenylene
bis(para-phenylene isocyanate), 1,3,4-oxadiazole
bis(meta-phenylene isocyanate), 1,3,4-oxadiazole
bis(meta-phenylene isocyanate)4-phenyl 1,2,4-triazole
bis (4-paraphenylene isocyanate thiazole 2-yl) metaphenylene
(2-phenylene)5,4'-benzimidazole diisocyanate
(2-phenylene)5,4'-benzoxazole diisocyanate
(2-phenylene)6,4'-benzothiazole diisocyanate
2,5-bis(2-phenylene isocyanate benzimidazole-6-ene) 1,3,4-oxadiazole
bis(para-phenylene isocyanate-2-benzimidazole-6-ene)
bis(para-phenylene isocyanate-2-benzoxazole-6-ene)

The preferred diisocyanate is tolylene diisocyanate (TDI) because it is inexpensive and has been found to work well.

The preparation of the urethane having a free isocyanate group is conducted in the presence of an inhibitor (i.e., a free radical scavenger) such as naphthoquinone, phenanthraquinone, 2,6-di-tert-butyl-4-methyl phenol, benzoquinone, hydroquinone, or methylquinone to prevent the spontaneous polymerization of acrylic groups. At least 0.01% inhibitor (based on the total weight of the Component A resin) should be used. If less inhibitor is used, the resin may gel. However, more than about 0.1% of the inhibitor should be avoided as the UV reactivity may then be low.

The reaction of the diisocyanate with the hydroxy acrylate proceeds readily at about 60° C. for 1 hour. A proportion of 1 mole of diisocyanate to 1 mole of the hydroxy acrylate should be used so that the resulting urethane compound has a free isocyanate group.

It is preferred that the urethane having a free isocyanate group be present in an amount of about 40 to 80% by weight.

(2) Reactive acrylate diluents

The acrylate diluents are used as reactive diluents to reduce the viscosity of resin and improve the storage stability of resin. The reactive acrylate diluents should possess good solvency characteristics for the urethane having a free isocyanate group. The reactive acrylate diluents should be free of active hydrogen, (i.e., hydroxy or amine groups), should have good solubility to resin, and low moisture permeability in the final cured coating. Acrylate monomers containing more than three acrylate functional groups should be avoided because they may cause the coating to be too brittle. Phenoxy ethyl acrylate (PEA) and hexanediol diacrylate (HDDA) are preferred acrylate diluents. However, any mono- or diacrylate monomers such as phenol ethoxylate monoacrylate, tetraethylene glycol diacrylate (TEGDA), 2-2-ethoxy ethoxy ethyl acrylate, tripropyl glycol diacrylate and mixtures thereof may be used.

The reactive acrylate diluents are preferably present in an amount of about 20 to 60% by weight.

(3) UV photoinitiators '35

Also required in the composition is a photoinitiator. The photoinitiator is a compound that generates free radicals when exposed to ultraviolet light. The free radicals then initiate the free radical chain polymerization of the acrylate groups in the composition. Photoinitiators are well known to those skilled in the art. They are often mixtures of several different compounds and are frequently proprietary.

The photoinitiators suitable for use in the present invention include glyoxalate derivatives, benzoin ether derivatives, alpha-acryloxime ester derivatives, acetophenone derivatives, and ketone-amine combinations.

Examples of suitable photoinitiators include: isobutyl benzoin ether (V-10, a product of Stauffer Chemical), isopropyl benzoin ether, benzoin ethyl ether, benzoin methyl ether, 1-phenol-1,2-propane-dione-2-(O-ethoxycarbonyl) oxime, 2,2-dimethoxy-2-phenyl-acetophenone (IRG-651, a product of Ciba Geigy), benzyl hydroxy-cyclohexyl phenyl ketone, diethoxyacetophenone, 2-hydroxy-2-methyl-1-phenyl-propane-1-one, and methyphenyl glyoxalate (V-55, a product of Stauffer Chemical).

The ketone-amine combination is preferably a primary or secondary, aliphatic or aromatic amine and ketones which include benzophenone, 2-chlorothioxanthone, isopropyl thioxanthone, 2-methylthioxanthone, chlorine functional substituted benzophenone, halogen substituted alkyl-arylketones, wherein halogen is chlorine, bromine, or iodine.

The photoinitiator may be mixtures of the abovedescribed suitable photoinitiators.

The UV photoinitiator may be present in either or both components. However, the total weight percentage of the photoinitiator in both components should not exceed about 10 percent, by weight.

(4) Additives

Additives modify certain properties of the compositions of the present invention such as flow, adhesion and fluoroescence.

Suitable adhesion promoters may be present in amounts of about 0–1% by weight, and preferably about 0.01 to 0.1% by weight, of the total composition weight. Phosphate or mercaptan derivatives, such as acrylated mercaptan (EB19-6375, a product of Radcure, Inc.) or acrylated phosphate ester (EB-19-6170, a product of Radcure, Inc.) and mixtures thereof may be added to the adhesive composition.

Various other compounds may be included in the composition as desired including, for example, dyes or pigments that are, however, UV transparent for easy inspection in the assembly line and flow control agents for easy application and reduced moisture permeability. Suitable flow control agents include alkylphenol ethoxylate, alcohol ethoxylate, fluorohydrocarbons such as fluorinated alkyl alkoxylate and ether sulfate.

Additives may be present in either or both components. However, the total weight percentage of the additive in both components should not exceed about 10%. It is preferred that the additives be present in Component (B).

(5) Polyisocyanate monomers

Polyisocyanate monomers are an optional ingredient in Component (A). The polyisocyanate monomers provide additional moisture cure capabilities. The polyisocyanate monomers may be either alkyl having a carbon length of 1 to 10 or an aromatic polyisocyanate. Aromatic polyisocyanates are preferred due to their high reactivity and good thermal stability. The polyisocyanate monomers should be compatible with other ingredients in the system and be in liquid form at room temperature. Suitable polyisocyanate monomers include toluene diisocyanate isomers, phenylene diisocyanate isomers, xylene diisocyanate isomers, and mixtures thereof. It is preferred that the isocyanate monomers be present in an amount of about 1 to 25% by weight.

Component B

The major ingredients of Component (B) of the UV conformal coating composition are (1) about 5 to 80% by weight of an acrylate-epoxy resin; (2) about 1 to 10% by weight of an acrylate-urethane resin; (3) about 10 to 94% by weight of reactive acrylate monomers which include about 10–50% acrylate monomers containing hydroxy functional group, about 10–50% acrylate monomers having good solubility to resins such as phenoxy ethyl acrylate; about 10–50% acrylate monomers having low moisture permeability for final cured coating, and about 1–15% acrylate monomers containing ether linkages for good coating adhesion; (4) about 0 to 10% photoinitiators and (5) about 0 to 10% additives.

Acrylate epoxy and acrylate urethane are oligomers which provide the main characteristics of the coating such as moisture and chemical resistance, flexibility, adhesion, toughness and hardness.

Optionally, about 5–80% epoxy resin, about 1–10% polyol, and/or about 5–80% acrylate epoxy urethane resin may also be included in the composition. The secondary hydroxy group in the optional epoxy resin can react with free isocyanate in Component (A) of the two-component system. The epoxy resin also improves the adhesion of the coating. The polyol reacts with any residual free isocyanate from Component (A). The acrylate epoxy urethane resin improves the adhesion, hardness and toughness of coatings.

Each of the elements of Component B will be discussed in detail below.

(1) Acrylate-epoxy resin

The acrylate-epoxy oligomer or resin is related to the UV curable compositions described in U.S. Pat. No. 4,481,258, assigned to the assignee of this invention and herein incorporated by reference.

The acrylate-epoxy oligomer used in the UV curable adhesive composition of this invention is an unsaturated epoxy oligomer dissolved in a reactive acrylate diluent. The unsaturated epoxy oligomer is a compound having both ethylenic unsaturation and free epoxy groups, and a molecular weight of from 2000 to 5000. Oligomers having a lower molecular weight tend to form a bond that is too brittle, and oligomers having a higher molecular weight tend to make the composition too viscous. Acrylic unsaturation is preferred as it cures faster, but allylic or vinylic unsaturation may also be used.

An acrylate-epoxy oligomer, the preferred oligomer, can be made by acrylating an epoxy resin. For example, an epoxy resin can be acrylated in a two-step reaction. In the first step, a hydroxy acrylate, a compound having both acrylate groups and a single hydroxyl group, is reacted with an anhydride or a diacid to form an ester having a free carboxylic acid group and a free acrylate group. The reaction occurs between a carboxylic group of the diacid or anhydride, and a hydroxyl group of the hydroxy acrylate. Suitable hydroxy acrylates that can be used in this reaction have been described in Component (A).

Suitable anhydrides that may be used include trimellitic anhydride, maleic anhydride, methylbicyclo [2.2.1] heptene-2,3-dicarboxylic anhydride, phthalic anhydride, methylnadic anhydride, and hexahydrophthalic anhydride. Di- or polyanhydrides can also be used but they are not preferred because they may cause the composition to gel. Suitable diacids that may be used include terephthalic acid, isophthalic acid, oxalic acid, adipic acid, and succinic acid. Trimellitic anhydride (TMA) and maleic anhydride (MA) are preferred because they give a composition having a longer pot life and better adhesion and better thermal stability.

The resulting ester is then reacted with an epoxy resin to form the acrylate-epoxy oligomer. The epoxy resin can have more than two epoxy groups, but diepoxides are preferred as more reactive polyepoxides may make the coating too brittle. The epoxy resin is preferably a bisphenol epoxy, such as bisphenol A epoxy resin, bisphenol F epoxy, a bisphenol S epoxy resin, or mixtures thereof, as these epoxy resins promote the best adhesion of the coating to the surface. Bisphenol A epoxy resin is the least expensive and provides an excellent bond on the substrate.

The epoxy resin should be soluble in a reactive diluent, and preferably a liquid acrylate which provides a liquid medium for the reactants. The reactive diluent reacts later and becomes part of the resin. Examples of suitable reactive diluents include phenoxyethyl acrylate (PEA), phenol ethoxylate monoacrylate, tetrahydrofurfuryl methacrylate, cyclohexyl methacrylate, n-hexyl methacrylate, 2-(2-ethoxyethoxy) ethyl acrylate and mixtures thereof. An inhibitor, such as benzoquinone, is included to deter reaction of the liquid acrylate during the epoxy resin-ester reaction. The preferred reactive diluent is phenoxy ethyl acrylate (PEA) because it possesses good solvency characteristics for the oligomer. Sufficient reactive diluent should be used to give the resin a workable viscosity; from 10 to 50% by resin weight of the reactive diluent is usually sufficient.

An epoxy catalyst, such as a tertiary amine, (e.g. triethanolamine (TEA)), may be used to promote the reaction of the ester and epoxy resin to form the oligomer. Generally, at least about 0.01% (all percentages herein are by weight unless otherwise indicated) catalyst (based on the weight of the resin composition) is required, and more than about 0.1% catalyst should be avoided as it makes the reaction difficult to control and may result in clouding.

The purpose of reacting the hydroxy acrylate with the anhydride or diacid is to produce an acrylate that will react with an epoxy group of an epoxy resin. Therefore, the hydroxy acrylate, the anhydride or diacid, and the epoxy resin should be used in such proportions that in the acrylate-epoxy oligomer all groups are reacted except for the acrylate group on the hydroxy acrylate and one epoxy group. The reaction proceeds with moderate heat at from 140° to 150° C. and is finished when the acid number is less than 5.

Alternatively, the resin may comprise an acrylate-epoxy oligomer by reacting a hydroxy acrylate, as described hereinbefore, and maleic anhydride. The resulting ester is reacted with an epoxy such as a bisphenol epoxy and/or an epoxy novolac in a reactive diluent such as phenoxy ethyl acrylate (PEA) containing an inhibitor such as benzoquinone. More than about 10% novolac should be avoided to prevent gelling.

It is preferred that the acrylate-epoxy resin be present in an amount of about 5 to 80% by weight.

(2) Acrylate-urethane oligomer

The second resin in the Component (B) is an acrylate urethane oligomer. This oligomer can be prepared by reacting a diisocyanate with a hydroxy acrylate first, then reacting further with caprolactam. Examples of suitable diisocyanates have been described in Component (A).

Suitable hydroxy acrylates can be selected from the hereinabove provided examples in Component (A). The preferred hydroxy acrylate is 2-hydroxyethyl acrylate because it results in a faster reaction. In this reaction, an isocyanate group of the diisocyanate reacts with the hydroxyl group of the hydroxy acrylate to produce a urethane. This reaction is conducted in the presence of an inhibitor (i.e., a free radical scavenger) such as naphthoquinone, phenanthraquinone, 2,6-di-tert-butyl-4-methyl phenol, benzoquinone, hydroquinone, or methylquinone to prevent the spontaneous polymerization of acrylic groups. At least 0.01% inhibitor (based on the total weight of the oligomer) should be used. If less inhibitor is used, the oligomer may gel. However, more than about 0.1% of the inhibitor should be avoided as the UV reactivity may then be low.

The reaction of the diisocyanate with the hydroxy acrylate proceeds readily at about 60° C. for 1 hour. A proportion of 1 mole of diisocyanate to 1 mole of the hydroxy acrylate should be used so that the resulting urethane compound has a free isocyanate group. That isocyanate group is then reacted with caprolactam to produce a urea linkage. The reaction with caprolactam can be performed at about 100° C. until no isocyanate peak is observed in an infrared absorption spectrometer. About 10 to about 50% by weight, based on the weight of the second resin, of an acrylate is then added as a diluent to make the oligomer less viscous. Suitable acrylate diluents may be found in the list provided hereinabove in Component (A), and PEA is again preferred. A description of the acrylate urethane resins can be found in U.S. Pat. No. 4,481,258 (herein incorporated by reference).

It is preferred that the acrylate urethane oligomer or resin be present in an amount of about 1 to 10%, by weight.

(3) Reactive acrylate monomers

Reactive acrylate monomers are preferably present in an amount of about 10 to 94% by weight. The reactive acrylate monomers include (a) acrylate monomers having a hydroxy functional group, (b) resin soluble acrylate monomers, (c) acrylate monomers having low moisture permeability, (d) an acrylate having ether linkages and mixtures thereof.

(a) Acrylate monomer having a hydroxy functional group

Suitable acrylates having a hydroxy functional group have been described in Component (A). They have general formulations such as:

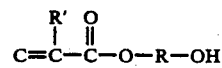

where R may be an aromatic or aliphatic chain of 1 to 10 carbons and R' may be hydrogen or an alkyl group having 1 to 10 carbons. The acrylate monomer having a hydroxy group is preferably present in an amount of about 10 to 50% by weight.

(b) Resin soluble acrylate monomers

Suitable resin soluble acrylate monomers include phenoxyethyl acrylate (PEA), phenol ethoxylate monoacrylate, tetrahydrofurfuryl methacrylate, n-hexyl methacrylate and mixtures thereof. The resin soluble acrylate monomer is preferably present in an amount of about 10 to 50% by weight.

(c) Acrylate monomers having low moisture permeability

Suitable acrylate monomers having low moisture permeability are preferably alkylene diacrylates having 1 to 10 carbons in the alkylene portion of the compound. Suitable examples include hexane diol diacrylate, ethylene glycol diacrylate, 1,3-butylene glycol diacrylate, 1,4-butanediol diacrylate and neopentyl glycol diacrylate and mixtures thereof. The acrylate monomer having low moisture permeability is preferably present in an amount of about 10 to 50% by weight.

(d) Acrylate monomers having ether linkages

Suitable acrylate monomers having ether linkages provide good adhesion and include ethylene glycol diacrylate (EGDA), tetraethylene glycol diacrylate (TEGDA), diethylene glycol diacrylate, ethoxylated bisphenol A diacrylate, tripropylene glycol diacrylate and mixtures thereof. The acrylate monomers having ether linkages are preferably present in an amount of about 1 to 15% by weight.

(4) Photoinitiators

Photoinitiators have been discussed above.

(5) Additives

Additives have been discussed above.

(6) Epoxy resin

An epoxy resin may be optionally added in an amount of about 5 to about 80% by weight to improve adhesion and to react the secondary hydrogen of the epoxy resin with the free isocyanate group of the urethane in Component (A). Suitable epoxy resins include bisphenol A epoxy, bisphenol F epoxy, bisphenol S epoxy and mixtures thereof. The molecular weight of epoxy resin is preferred to be less than 2000, because a high molecular weight epoxy makes the formulation too viscous for application. The preferred epoxy is bisphenol A epoxy.

(7) Polyol

An optional polyol may be added in an amount of about 1 to 10%, by weight, in order to react with any residual isocyanates from the urethane in Component (A). A polyol has the formula HO—R—OH where R may be aromatic or aliphatic, preferably having 1 to 10 carbons. Aliphatic polyols are most preferred for high reactivity. Polyols having more than 4 carbons are particularly preferred. Suitable polyols include butanediol, hexanediol, ethylene glycol, tetraethylene glycol, and mixtures thereof.

(8) Acrylate epoxy urethane

An acrylate epoxy urethane may be optionally added in an amount of about 5 to 80% by weight in order to improve adhesion, hardness and toughness characteristics of the composition.

The acrylated epoxy urethane may be prepared using an epoxy resin, such as a bisphenol epoxy resin which includes a bisphenol A epoxy resin, a bisphenol F epoxy resin, or a bisphenol S epoxy resin, as these epoxy resins promote adhesion of the coating to the surface. A bisphenol A epoxy resin is most preferred because it is less expensive. The epoxy resin should also be soluble in a liquid acrylate, which is used as a solvent for the reactants. The liquid acrylate is later reacted into the coating. Examples of suitable liquid acrylates include phenol ethoxylate monoacrylate, tetrahydrofurfuryl methacrylate, cyclohexyl methacrylate, n-hexyl methacrylate, 2-(2-ethoxy ethoxy) ethyl acrylate, phenoxy ethyl acrylate (PEA) and mixtures thereof. The preferred liquid acrylate is phenoxy ethyl acrylate (PEA). Sufficient liquid acrylate of about 10 to 50% (by weight) should be used to give the resin a workable viscosity.

An epoxy catalyst, a tertiary amine, such as triethylamine, triethanolamine, benzyldimethylamine, and mixtures thereof, is also included in the resin. Generally, at least about 0.01% (all percentages herein are by weight unless otherwise indicated) catalyst (based on the weight of copolymer) is required, and more than about 0.1% catalyst should be avoided as it causes the polymer to gel and may result in clouding.

A dual functional acrylate monomer or reactant is used to react with epoxy to obtain an acrylate epoxy urethane oligomer. Isocyanato ethyl methacrylate manufactured by Norquay Technology Inc., Chester, Pa., is a preferred monomer. The dual functional reactant may also be prepared by reacting one mole of hydroxy terminated acrylate, such as hydroxy ethyl acrylate, with one mole of diisocyanate such as toluene diisocyanate. Other Examples of suitable hydroxy acrylates has been described in Component (A). The hydroxy ethyl acrylate is preferred because of its high reactivity. Other aliphatic and aromatic diisocyanates also can be used to make acrylate isocyanate monomer. These isocyanates have been described hereinabove in Component (A).

The acrylated epoxy urethane oligomer is usually obtained by reacting one mole of epoxy resin with one mole acrylate isocyanate monomer. The molar ratio range of epoxy to acrylate isocyanate is about 1:1 to 1:5. If the ratio is less than about 1:1, the curing rate may be too slow and if the ratio is higher than 1:5, the coating may be too brittle.

Table 1 describes certain presently preferred resin compositions used in the present invention.

TABLE 1

| Resin Composition for UV-Moisture-Anaerobe Conformal Coatings | |
|---|---|
| Resin | Composition* Mole/Component |
| 10035 | 1/HEA, 1 TDI |
| 12524 | 1/HEA-TMA, 2/Epon 1004; in 50% PEA |
| 10736 | 1/HEA-TMA, 2/Epon 1007; in 50% PEA |
| 12061 | 1/Epon 1004, 1/IEM; in 50% PEA |
| 11608 | 1/HEA, 1/TDI, 1/Caprolactam; in 20% PEA |

Table 2 illustrates examples of Component (A) compositions. Table 3 illustrates examples of Component (B) compositions.

TABLE 1-continued
Resin Composition for UV-Moisture-Anaerobe Conformal Coatings

TABLE 2
Composition of First Part of UV-Moisture-Anaerobe Curable Conformal Coatings

| Formulation | 10035 | 10035-1 | 10736 | RBM4-31 | TDI | PEA | HDDA | IRG651 | FC-171 |
|---|---|---|---|---|---|---|---|---|---|
| SC-1# | 96.15 | — | — | — | — | — | — | 3.85 | — |
| SC-2# | — | 96.15 | — | — | — | — | — | 3.85 | — |
| SC-3# | 76.92 | — | — | — | — | 9.61 | 9.61 | 3.85 | — |
| SC-4# | 76.92 | — | — | — | 19.23 | — | — | 3.85 | — |
| SC-5 | — | — | — | — | 19.10 | — | 72.90 | 8.00 | — |
| SC-6 | — | — | — | — | 19.10 | — | 72.90 | 8.00 | 0.10 |
| SC-7 | — | — | — | — | 19.10 | — | 72.90 | 8.00 | 0.10 |
| SC-8 | — | — | — | — | 19.10 | — | 72.90 | 8.00 | 0.10 |
| SC-9 | 50.00 | — | — | — | — | 50.00 | — | — | — |
| SC-10 | 50.00 | — | — | — | — | 50.00 | — | — | — |
| SC-11 | 50.00 | — | — | — | — | 50.00 | — | — | — |
| SC-12 | 50.00 | — | — | — | — | 50.00 | — | — | — |
| SC-13 | 48.00 | — | — | — | — | 48.00 | — | 4.00 | — |
| SC-15 | — | — | — | 100.00 | — | — | — | — | — |
| SC-16 | — | — | — | 100.00 | — | — | — | — | — |
| SC-17 | — | — | — | 75.13 | — | 24.87 | — | — | — |

*10035: Acrylate urethane with free isocyanate
10035-1: Acrylate urethane with free isocyanate
10736: Acrylate epoxy
RBM4-31: Urethane with free isocyanate
TDI: Toluene diisocyanate
PEA: Phenoxy ethyl acrylate
HDDA: Hexanediol diacrylate
Irg 651: 2,2-dimethoxy-2-phenyl acetophenone
FC-171: Fluorohydrocarbon, 3M
SC-1, SC-2, SC-3, SC-4 are single component moisture curable urethane coatings.

| Resin | Composition* Mole/Component |
|---|---|
| RBM4-31 | 3/MCHDI, 1/PTMG 1000 |

*HEA: Hydroxy ethyl acrylate
TDI: Toluene diisocyanate
TMA: Trimellitic anhydride
Epon 1004: Bisphenol A epoxy with epoxy equivalent 875
Epon 1007: Bisphenol A epoxy with epoxy equivalent 2250
PEA: Phenoxy ethyl acrylate
IEM: Isocyanate ethyl methacrylate
PTMG 1000: Polyoxytetra methylene glycol with molecular weight 1000
MCHDI: 4,4'-methylene-bis (cyclohexyl isocyanate)

TABLE 3
Compositions of Second Part of UV-Moisture Anaerobe Curable Conformal Coatings

| Formulation | EPON 1004 | EPON 1007 | 12524 | 12061 | 11608 | 10736 | Butanediol | HEA | HPMA |
|---|---|---|---|---|---|---|---|---|---|
| SC-5 | 50.00 | — | — | — | — | — | — | 12.72 | — |
| SC-6 | 50.00 | — | — | — | — | — | — | 12.72 | — |
| SC-7 | 43.86 | 6.14 | — | — | — | — | — | 12.72 | — |
| SC-8 | — | — | 76.54 | — | — | 10.75 | — | 12.72 | — |
| SC-9 | — | — | — | — | — | — | 5.95 | 20.52 | — |
| SC-10 | 5.96 | — | — | — | — | — | — | 20.52 | — |
| SC-11 | — | — | — | 38.71 | — | — | — | 21.22 | — |
| SC-12 | — | — | — | — | — | 38.71 | — | 21.22 | — |
| SC-13 | — | — | — | — | 3.21 | 28.70 | — | — | 24.81 |
| SC-14 | — | — | — | — | 3.74 | 33.40 | — | — | 12.60 |
| SC-15 | — | — | — | — | — | — | — | — | 31.87 |
| SC-16 | — | — | — | — | — | — | — | — | 31.87 |
| SC-17 | — | — | — | — | — | 21.37 | — | — | 25.06 |

| Formulation | PEA | HDDA | TEGDA | IRG651 | FC-171 | Acrylic Acid |
|---|---|---|---|---|---|---|
| SC-5 | 37.28 | — | — | — | — | — |
| SC-6 | 37.28 | — | — | — | — | — |
| SC-7 | 37.28 | — | — | — | — | — |
| SC-8 | — | — | — | — | — | — |
| SC-9 | 34.87 | 32.00 | — | 6.51 | 0.19 | — |
| SC-10 | 34.87 | 32.00 | — | 6.51 | 0.19 | — |
| SC-11 | — | 33.12 | — | 6.75 | 0.23 | — |
| SC-12 | — | 33.12 | — | 6.75 | 0.23 | — |
| SC-13 | 25.84 | 10.88 | 3.98 | 2.81 | 0.27 | — |
| SC-14 | 30.08 | 12.67 | 4.63 | 3.27 | 0.27 | — |
| SC-15 | 11.06 | 38.93 | 11.06 | 6.64 | 0.22 | 5.53 |
| SC-16 | 11.06 | 33.62 | 11.06 | 6.64 | 0.22 | 5.53 |

TABLE 3-continued
Compositions of Second Part of UV-Moisture Anaerobe Curable Conformal Coatings

| | | | | | | |
|---|---|---|---|---|---|---|
| SC-17 | 8.70 | 26.44 | 8.70 | 5.22 | 0.17 | 4.35 |

*EPON 1004: Bisphenol A epoxy with epoxy equivalent weight 875
EPON 1007: Bisphenol A epoxy with epoxy equivalent weight 2250
12524: Acrylate epoxy
11608: Acrylate urethane
12061: Acrylate epoxy
10736: Acrylate epoxy
HEA: Hydroxy ethyl acrylate
HPMA: Hydroxy propyl methacrylate
PEA: Phenoxy ethyl acrylate
HDDA: Hexanediol diacrylate
TEGDA: Tetraethylene glycol diacrylate
IRG651: 2,2-dimethoxy-2-phenyl acetophenone
FC-171: Fluorohydrocarbon, 3M Table 4 summarizes the final composition after components (A) and (B) are mixed.

Each component has a shelf life greater than 3 months. The mixture of components (A) and (B) has a workable low viscosity in the range of 200 to 300 cps over an 8 hour period at room temperature, so the coating can be easily sprayed, dip coated, or knife coated on the substrate. The coatings can be cured upon UV exposure. While not wishing to be bound by theory, it is believed that in the shadow areas, the urethane having the free isocyanate group in the coating reacts with moisture from the atmosphere first to generate carbon dioxide which creates a localized anaerobic environment, so the acrylates in the coating are subsequently cured anaerobically. These new conformal coating compositions exhibit good performance as shown in Tables 5 and 6. The properties of cure rate, moisture permeability and electric insulation are better than that of commercially available UV two-component conformal coatings.

EXAMPLES Preparation of two-component conformal coating Formulation I (SC-13)

Preparation of Component A

| Ingredients | Amount (grams) |
|---|---|
| Hydroxy ethyl acrylate (HEA) | 696 |
| Toluene diisocyanate (TDI) | 1044 |
| Benzoquinone (BQ) | 1.8 |
| Phenoxy ethyl acrylate (PEA) | 884.4 |
| UV photoinitiator 2,2-dimethoxy-2-phenyl-acetophenone (Irg 651) | 104.5 |

Reaction Procedures:

A 5 liter flask is prepared having a thermometer, stirrer, nitrogen sparge or dry air (min.), and a water condenser. TDI is added to the flask. BQ is dissolved in HEA and the mixture is added into the TDI gradually and slowly. The temperature should remain below about 60° C. while adding the mixture into flask. The mixture is reacted at 60° C. for about one hour, then PEA and Irg 651 are added and mixed well for about 30 min. The viscosity of the resin at 25° C. should be about 200 cps/25° C. The resin should be stored preferably under dry air or dry nitrogen in an air-tight amber plastic bottle and kept away from moisture.

Preparation of Component (B)

| Ingredients | Amount (grams) |
|---|---|
| Epon 1007F (Bisphenol A Epoxy) | 139.6 |
| Phenoxy ethyl acrylate (PEA) | 130 |
| Adduct of hydroxy ethyl acrylate (HEA) and trimellitic anhydride (TMA) | 4.7 |
| Triethanolamine (TEA)/PEA | 0.085 TEA in 12.6 PEA |
| Acrylate urethane in PEA | 290.5 |
| Tetraethyleneglycol diacrylate (TEGDA) | 39.8 |
| Hexanedioldiacrylate (HDDA) | 108.8 |
| Hydroxy propyl methacrylate (HPMA)* | 248 |
| UV photoinitiator 2,2-dimethoxy-2 phenyl-acetophenone (Irg 651) | 28.1 |
| Flow control agent fluoro-hydrocarbon (FC-171) | 1.9 |

*HPMA - Rohm and Haas Rocryl 410

Reaction Procedures:

A 2-3 liter flask is prepared having a stirrer, nitrogen or dry air sparge (min), water condenser and thermometer. Epon 1007F is dissolved in PEA at about 100°0 C. The adduct of HEA and TMA and TEA in PEA are added into the flask and heated to about 140-150 C. The mixture is reacted at about 140°-150° C. for about 1.5 hours and until the acid number is below 5. The mixture is cooled to about 80° C. The acrylate urethane in PEA, TEGDA, HDDA, HPMA, Irg 651 and FC-171 are added and mixed well for about a half hour. The viscosity of the reaction mixture is measured at 25° C. and is preferably about 200 cps/25° C. The resin is stored under dry air (preferred) or nitrogen in an air-tight amber plastic bottle and kept away from moisture.

The preparation of the adduct of hydroxy ethyl acrylate (HEA) and trimellitic anhydride (TMA)

| | Amount (grams) |
|---|---|
| Hydroxy ethyl acrylate (HEA) | 403 |
| Benzoquinone (BQ) | 9.3 |
| Trimellitic anhydride (TMA) | 666.8 |

Reaction Procedures:

A 2-3 liter flask having a stirrer, nitrogen sparge (min), water condenser and thermometer is prepared. HEA and BQ are added into the flask and the temperature is set at about 100° C. TMA is added portionwise over about a half hour period. The mixture is reacted at about 150° C. for about one hour. The resin is drained while it is hot in an aluminum pan and broken into small pieces before the preparation of Component (B).

| Preparation of acrylate urethane in PEA | |
|---|---|
| Ingredients | Amount (grams) |
| Toluene diisocyanate (TDI) | 34.82 |
| Benzoquinone (BQ) | 0.012 |
| Hydroxy ethyl acrylate (HEA) | 23.22 |
| Caprolactam | 22.62 |
| Phenoxy ethyl acrylate (PEA) | 834.29 |

Reaction Procedures:

A 2–3 liter flask is prepared having stirrer, thermometer, dry nitrogen or air sparge (min), and water condenser. TDI is added into the flask. HEA and BQ are mixed and added into the TDI gradually and slowly. The exotherm temperature should be kept below about 60° C. The mixture is reacted at about 60° C. for about one hour. The caprolactam is added and reacted at about 100° C. for about one hour. PEA is added and mixed well for about a half hour.

Preparation of Formulation I (SC-13) Conformal Coating

Mix equal parts (by weight) of Components A and B together well before application. The mixture should be used in about 8 hours.

Formulation II (SC-14)

Preparation of Components (A) and (B)

The preparation procedures are the same as Formulation I except the amount of each ingredient of Component B is different and shown in the following:

Component (A) is the same as Component (A) of Formulation I.

| Component (B) | |
|---|---|
| Ingredients | Amount (grams) |
| Bisphenol A (Epon 1007F) | 162.46 |
| Phenoxy ethyl acrylate (PEA) | 151.29 |
| Adduct of PEA and TMA | 5.47 |
| Triethanolamine (TEA)/PEA | 0.01 TEA in 14.7 PEA |
| Acrylate urethane in PEA | 338.2 |
| Tetraethyleneglycol diacrylate (TEGDA) | 46.3 |
| Hexanedioldiacrylate (HDDA) | 126.7 |
| Hydroxy propyl methacrylate (HPMA)* | 125 |
| UV Photoinitiator (2,2-dimethoxy-2-phenyl-acetophenone (Irg 651) | 32.7 |
| Flow control agent fluoro-hydrocarbon (FC-171) | 1.9 |

*HPMA Rohm and Haas Rocryl 410.

Preparation of Formulation II Conformal Coating

Mix one part (by weight) of Component (A) and two parts of Component (B) together well before application and use the mixture in about 8 hours.

TABLE 4

FINAL COMPOSITION OF CONFORMAL COATING AFTER MIXING PART 1 AND PART 2

| FORMULATION | 10035 | 10035-1 | RBM4-31 | EPON 1004 | EPON 1007 | 12524 | 12061 | 10736 | 11608 | BUTANEDIOL |
|---|---|---|---|---|---|---|---|---|---|---|
| SC-1 | 96.15 | — | — | — | — | — | — | — | — | — |
| SC-2 | — | 96.15 | — | — | — | — | — | — | — | — |
| SC-3 | 76.92 | — | — | — | — | — | — | — | — | — |
| SC-4 | 76.92 | — | — | — | — | — | — | — | — | — |
| SC-5 | — | — | — | 25.00 | — | — | — | — | — | — |
| SC-6 | — | — | — | 25.00 | — | — | — | — | — | — |
| SC-7 | — | — | — | 21.93 | 3.07 | — | — | — | — | — |
| SC-8 | — | — | — | — | — | 38.27 | — | 5.38 | — | — |
| SC-9 | 25.00 | — | — | — | — | — | — | — | — | 2.98 |
| SC-10 | 25.00 | — | — | 2.98 | — | — | — | — | — | — |
| SC-11 | 25.00 | — | — | — | — | — | 19.35 | — | — | — |
| SC-12 | 25.00 | — | — | — | — | — | — | 19.36 | — | — |
| SC-13 | 23.75 | — | — | — | — | — | — | 14.52 | 1.62 | — |
| SC-14 | 15.86 | — | — | — | — | — | — | 22.36 | 2.50 | — |
| SC-15 | — | — | 50.00 | — | — | — | — | — | — | — |
| SC-16 | — | — | 50.00 | — | — | — | — | — | — | — |
| SC-17 | — | — | 27.36 | — | — | — | — | 13.59 | — | — |

| FORMULATION | HEA | HPMA | PEA | HDDA | TEGDA | IRG651 | FC171 | ACRYLIC ACID | TDI |
|---|---|---|---|---|---|---|---|---|---|
| SC-1 | — | — | — | — | — | 3.85 | — | — | — |
| SC-2 | — | — | — | — | — | 3.85 | — | — | — |
| SC-3 | — | — | 9.61 | 9.61 | — | 3.85 | — | — | — |
| SC-4 | — | — | — | — | — | 3.85 | — | — | 19.23 |
| SC-5 | 6.36 | — | 18.64 | 36.45 | — | 4.00 | — | — | 9.55 |
| SC-6 | 6.36 | — | 18.64 | 36.45 | — | 4.00 | 0.01 | — | 9.55 |
| SC-7 | 6.36 | — | 18.64 | 36.45 | — | 4.00 | 0.05 | — | 9.55 |
| SC-8 | 6.36 | — | — | 36.45 | — | 4.00 | 0.05 | — | 9.55 |
| SC-9 | 10.26 | — | 42.44 | 16.00 | — | 3.25 | 0.10 | — | — |
| SC-10 | 10.26 | — | 42.44 | 16.00 | — | 3.25 | 0.10 | — | — |
| SC-11 | 10.61 | — | 25.00 | 16.56 | — | 3.25 | 0.12 | — | — |
| SC-12 | 10.61 | — | 25.00 | 18.79 | — | 3.32 | 0.12 | — | — |
| SC-13 | — | 12.55 | 36.82 | 5.51 | 2.01 | 3.31 | 0.13 | — | — |
| SC-14 | — | 8.37 | 36.00 | 8.48 | 3.10 | 3.49 | 0.14 | — | — |
| SC-15 | — | 15.94 | 5.53 | 19.47 | 5.53 | 3.32 | — | — | — |
| SC-16 | — | 15.94 | 5.53 | 16.81 | 5.53 | 3.32 | 0.11 | 2.77 | — |
| SC-17 | — | 15.94 | 14.59 | 16.82 | 5.53 | 3.32 | 0.11 | 2.77 | — |

*All the formulations were mixed by one part (wt.) of Part 1 and one part of Part 2 except SC-14 was mixed by one part of Part 1 and two parts of Part 2 and SC-17 was mixed by one part of Part 1 and 1.75 parts of Part 2.

TABLE 5

Adhesion and Hardness of Two Component Conformal Coatings

| Formulation | Cross Hatch Adhesion (% ASTM D3359) FR-4 | Cross Hatch Adhesion (% ASTM D3359) Tin | Pencil Hardness (ASTM D3363) FR-4 | Pencil Hardness (ASTM D3363) Tin | Heat Shock ⅛" Mandrel bend 150° C./0.5 hr | Comment |
|---|---|---|---|---|---|---|
| SC-1 | 0 | 0 | — | — | 0.5 | Very brittle coating |
| SC-2 | 0 | 0 | — | — | — | Very brittle coating |
| SC-3 | 0 | 0 | 3H | — | — | Very brittle coating |
| SC-4 | 0 | 0 | 3H | — | — | Very brittle coating |
| SC-5 | 100 | 97 | 3H | 3H | — | Good coating |
| SC-6 | 100 | 100 | 2H | — | Pass | Good coating |
| SC-7 | 100 | 0 | 3H | 2H | Fail | Poor adhesion on tin |
| SC-8 | 100 | 0 | 3H | F | Fail | Poor adhesion on tin |
| SC-9 | 100 | 0 | 3H | 2H | — | Poor adhesion on tin |
| SC-10 | 100 | 0 | 3H | 2H | — | Poor adhesion on tin |
| SC-11 | 100 | 0 | 3H | 2H | — | Poor adhesion on tin |
| SC-12 | 100 | 0 | 3H | 2H | — | Poor adhesion on tin |
| SC-13 | 100 | 100 | 3h | 2H | Pass | Good coating |
| Sc-14 | 100 | 100 | 3H | 2H | Pass | Good coating |
| SC-15 | — | 100 | — | HB | — | Slow cure, need double exposure poor stability |
| SC-16 | — | 75 | — | HB | Pass | Viscosity too high |
| SC-17 | — | 100 | — | H | Fail | Viscosity too high |

TABLE 6

Properties of Two-Component Conformal Coatings

| Properties | SC-6 | SC-13 | SC-14 | Loctite 361 |
|---|---|---|---|---|
| Solvent in system | No | No | No | Yes |
| Pot life (hours) | 8 | 8 | 8 | 8 |
| No. of component | 2 | 2 | 2 | 2 |
| Viscosity (cps/25° C.0) | 200 | 200–300 | 200–300 | 70 |
| Cure schedule | | | | |
| Exposed to UV light (sec) | 2–4 | 2–4 | 2–4 | overnight |
| Shadow area (day) | 3 | 3 | 3 | 3 |
| Dielectric constant (25° C., 1MHz, ASTM D2305) | 3.3 | 3.1 | 3.3 | 3.9 |
| Dissipation factor (25° C., 1MHz, ASTM D2305) | 0.0280 | 0.0249 | 0.0289 | 0.0570 |
| Dielectric Strength (V/mil) (ASTM D149, 2 mil film) | 2592 | 2349 | 2839 | 1917 |
| Volume resistivity (ohm-cm) (ASTM D257) | $3.4 \times 10^{14}$ | $7.2 \times 10^{15}$ | $4.8 \times 10^{15}$ | $1.1 \times 10^{13}$ |
| Surface resistivity (ohm/sq) (ASTM D257) | $3.0 \times 10^{14}$ | $9.2 \times 10^{16}$ | $1.7 \times 10^{17}$ | $8.1 \times 10^{12}$ |
| Flexibility (Mil-1-46058C) | Pass | Pass | Pass | Pass |
| Specific permeability (mg/cm² day, ASTM D1653) | 0.3174 | 0.2488 | 0.1717 | — |
| Cross hatch adhesion (%) | | | | |
| (ASTM D3359) Tin | 100 | 100 | 100 | 100 |
| FR-4 | 100 | 100 | 100 | 100 |
| Linear TEC (°C.⁻¹) | | $3.28 \times 10^{-4}$ | $2.08 \times 10^{-4}$ | $3.009 \times 10^{-4}$ |
| Glass Transition Temp. ($T_g$ °C.) | 60 | 38 | 43 | 17 |

It will be appreciated that the above-described invention provides a UV curable conformal coating composition with low moisture permeability, a quick cure, good electrical insulating properties, and shadow cure capabilities. The problem of ineffective cure of the shadow areas is eliminated by the composition of the present invention. This composition may be applied by spray, dipping or knife coating and cured by UV in a short time. The conformal coating of the present invention is especially useful in automated printed wiring board assembly lines.

Whereas particular embodiments of the invention have been described above for purposes of illustration, it will be appreciated by those skilled in the art that numerous variations of the details may be made without departing from the invention as described in the appended claims.

I claim:

1. An ultraviolet radiation curable conformal coating composition comprising the mixture:
    Component (A) which comprises a mixture of (1) about 40% to 80% by weight, of a urethane having a free isocyanate group; (2) about 20% to 60% by weight of reactive acrylate diluents; (3) from 0% to about 10% by weight, of UV photoinitiators; (4) from 0% to 10%, by weight, of additives selected from adhesion promoters, pigments, dyes, flow control agents and their mixtures; and
    Component (B) which comprises a mixture of (1) about 5% to 80% by weight, of an acrylate-epoxy resin which comprises an unsaturated epoxy oligomer having a molecular weight of from 2000 to 5000, where the epoxy in said oligomer is a bisphenol epoxy; (2) about 1% to 10% by weight, of an acrylate-urethane oligomer; (3) about 10% to 94% by weight of reactive acrylate monomers including acrylate monomer having a hydroxy functional group; (4) from 0% to 10%, by weight, of UV photoinitiators; and (5) from 0% to 10%, by weight, of additives selected from adhesion promoters, pigments, dyes, flow control agents and their mixtures; with the proviso that photoinitiator be present in one or both components and that the total percentage weight, based on total composition weight, of said UV photoinitiators plus additives not be less than 1 percent and not exceed about 10 percent.

2. The composition according to claim 1 wherein said Component (A) includes about 1% to 25%, by weight of polyisocyanate monomers.

3. The composition according to claim 1 wherein said reactive acrylate diluents have good solvency for said urethane having a free isocyanate group.

4. The composition according to claim 1 wherein said reactive acrylate monomers are selected from the group consisting of acrylate monomers having a hydroxy functional group, resin soluble acrylate monomers, acrylate monomers having low moisture permeability, acrylate monomers having ether linkages, and mixtures thereof.

5. The composition according to claim 1 wherein Component (B) includes about 5% to 80%, by weight, of an epoxy resin.

6. The composition according to claim 1 wherein Component (B) includes about 1% to 10%, by weight, of a polyol.

7. The composition according to claim 1 wherein Component (B) includes about 5% to 80%, by weight, of an acrylate epoxy urethane.

8. The composition according to claim 1 wherein said reactive acrylate monomers include about 10% to 50%, by weight, of an acrylate monomer having a hydroxy functional group.

9. The composition according to claim 4, wherein said reactive acrylate monomers include about 10% to 50%, by weight, of a resin soluble acrylate monomer.

10. The composition according to claim 4 wherein said reactive acrylate monomers include about 10% to 50% by weight, of an acrylate having low moisture permeability.

11. The composition according to claim 4 wherein said reactive acrylate monomers include about 1% to 15% by weight, of an acrylate monomer having ether linkages.

12. The composition according to claim 1 wherein said urethane having a free isocyanate group in Component (A) is prepared by reacting alcohols or polyols with one stoichiometric equivalent of excess polyisocyanate, in the presence of from 0.01% to 0.1% by weight, based on Component (A), of an inhibitor, and where the composition has a viscosity in the range of 200 cps. to 300 cps. over an 8 hour period at room temperature.

13. The composition according to claim 12 wherein said alcohols or polyols contain an acrylate functional group.

14. The composition according to claim 13 wherein said polyol is hydroxyethyl acrylate and said polyisocyanate is toluene diisocyanate.

15. The composition according to claim 1 wherein said Component (A) reactive acrylate diluents are free of active hydrogen groups.

16. The composition according to claim 1 wherein said reactive acrylate diluents are monoacrylate monomers or diacrylate monomers.

17. The composition according to claim 1 wherein said reactive acrylate diluents of Component (A) are selected from the group consisting of phenoxy ethyl acrylate, hexanediol diacrylate, phenol ethoxylate monoacrylate tetraethylene glycol diacrylate, ethylacrylate, 2-(2-ethoxy ethoxy) tripropyl glycol diacrylate and mixtures thereof.

18. The composition according to claim 1 wherein said acrylate epoxy resin is prepared by reacting an anhydride or a diacid with a hydroxy acrylate followed by reaction with a bisphenol epoxy.

19. The composition according to claim 1 wherein said acrylate urethane oligomer is prepared by reacting a diisocyanate with a hydroxy acrylate to form a urethane followed by reaction of said urethane with caprolactam.

20. A composition according to claim 1 wherein said photoinitiators are selected from the group consisting of glyoxylate derivatives, benzoin ether derivatives, alpha-acryloxime ester derivatives, acetophenone derivatives, ketone-amine combinations and mixtures thereof, where the composition has a viscosity in the range of 200 cps. to 300 cps. over an 8 hour period of room temperature, and where the composition is capable of U.V. cure in shadow areas hidden from a U.V. light source.

21. The composition according to claim 8 wherein said acrylate monomer having a hydroxy functional group is selected from the group consisting of hydroxyl ethyl acrylate, 3-hydroxyl propyl acrylate, 2-hydroxymethacrylate, hydroxy-beta-carboxy ethyl acrylate, 3-hydroxy methacrylate, hydroxyhexyl acrylate, hydroxy octyl methacrylate, 2-hydroxy propyl acrylate, 2-hydroxy ethyl methacrylate, and mixtures thereof.

22. The composition according to claim 9 wherein said resin soluble acrylate monomers are selected from the group consisting of phenoxy ethyl acrylate, phenol ethoxylate monoacrylate, tetrahydrofurfuryl methacrylate, n-hexylmethacrylate, and mixtures thereof.

23. The composition according to claim 10 wherein said acrylate having low moisture permeability is an alkylene diacrylate.

24. The composition according to claim 23 wherein said acrylates having low moisture permeability are selected from the group consisting of 1,6-hexanediol diacrylate, ethylene glycol diacrylate, 1,3-butylene glycol diacrylate, 1,4-butanediol diacrylate, neopentyl glycol diacrylate, and mixtures thereof.

25. The composition according to claim 12 wherein said acrylate monomers in Component (B), have ether linkages and are selected from the group consisting of ethylene glycol diacrylate, tetraethylene glycol diacrylate, diethylene glycol diacrylate, ethoxylated bisphenol A diacrylate, tripropylene glycol diacrylate and mixtures thereof.

26. The composition according to claim 1 wherein said flow control agent is a fluorocarbon.

27. The composition according to claim 1 wherein said adhesion promoter is selected from the group consisting of acrylate mercaptan, acrylate phosphate and mixtures thereof.

28. A composition according to claim 1 in the form of a thin coating on a substrate.

29. A composition according to claim 28 wherein said substrate is a printed wiring board.

30. The composition according to claim 5 wherein said epoxy resin is a bisphenol epoxy.

31. The composition according to claim 6 wherein said polyol is an aliphatic having 1 to 10 carbons or aromatic.

32. The composition according to claim 7 wherein said acrylate epoxy urethane is the reaction product of a bisphenol epoxy and isocyanato ethyl methacrylate.

33. The composition according to claim 1 wherein Component (A) and Component (B) are present in about equal parts by weight.

34. The composition according to claim 1 wherein Component (A) and Component (B) are present in about a 1 to 2 ratio, by weight.

35. The composition according to claim 1 wherein the composition consists essentially of the mixture of Component (A) and Component (B) and Component (B) is present in an amount at least equal to Component (A).

36. The composition according to claim 12 wherein the weight ratio of Component (A):Component (B) is from about 1:1 to about 1:2, the alcohols or polyols may possess acrylate functional groups, and Component (A) consists essentially of a mixture of (1), (2), (3) and (4).

37. An ultraviolet radiation curable composition consisting essentially of the mixture:

Component (A) which consists essentially of a mixture of (1) about 40% to 80% by weight, of a urethane having a free isocyanate group consisting essentially of the reaction mixture of alcohols or polyols with one stoichiometric equivalent of excess polyisocyanate in the presence of an inhibiter, where the alcohols or polyols may possess acrylate functional groups; (2) about 20% to 60% by weight of reactive acrylate diluents free of active hydrogen and containing no more than three acrylate functional groups; (3) from 0% to about 10%, by weight, of UV photoinitiators; (4) from 0% to 10%, by weight, of additives selected form adhesion promoters, pigments, dyes, flow control agents and their mixtures; and Component (B) which comprises a mixture of (1) about 5% to 80% by weight, of an acrylate-epoxy resin which comprises an unsaturated epoxy oligomer having a molecular weight of from 2000 to 5000, where the epoxy in said oligomer is a bisphenol epoxy; (2) about 1% to 10% by weight, of an acrylate-urethane oligomer; (3) reactive acrylate monomers including from 10% to 50% by weight of acrylate monomer having a hydroxy functional group; (4) from 0% to 10%, by weight, or UV photoinitiators; and (5) from 0% to 10%, by weight, of additives selected from adhesion promoters, pigments, dyes, flow control agents and their mixtures; with the proviso that photoinitiator be present in one or both components and that the total percentage weight, based on total composition weight, of said UV photoinitiators plus additives not be less than 1 percent and not exceed about 10 percent; and where the weight ratio of Component (A):Component (B) of from about 1:1 to about 1:2.

38. The composition according to claim 37 where polyisocyanate monomer is also added to the mixture of Component (A), and where the composition has a viscosity in the range of 200 cps. to 300 cps. over an 8 hour period at room temperature, and where part (1) of Component (A) consists essentially of the reaction mixture of hydroxy acrylate with one stoichiometric equivalent of excess polyisocyanate in the presence of from 0.01% to 0.1% by weight, based on Component (A) of an inhibitor.

39. The composition according to claim 37 wherein the urethane of Component (A) is a reaction mixture of hydroxy ethyl acrylate, toluene diisocyanate and an inhibitor; the reactive acrylate diluent is selected from the group consisting of phenoxy ethyl acrylate and hexane diol diacrylate; and the weight ratio of Component (A):Component (B) is about 1:2, and where the composition is capable of U.V. cure in shadow areas hidden from a U.V. light source.

40. An ultraviolet radiation curable, low viscosity, conformal coating composition consisting essentially of the mixture:

Component (A) which consists essentially of a mixture of (1) about 40% to 80% by weight, of a urethane having a free isocyanate group, where said urethane is a reaction mixture of hydroxy ethyl acrylate, toluene diisocyanate and an inhibitor; (2) about 20% to 60% by weight of phenoxy ethyl acrylate; (3) from 0% to about 10% by weight, of UV photoinitiators; (4) from 0% to 10%, by weight, of additives selected from adhesion promoters, pigments, dyes, flow control agents and their mixtures; and Component (B) which comprises a mixture of (1) about 5% to 80% by weight, of an acrylate-epoxy resin which comprises an unsaturated epoxy oligomer having a molecular weight of from 2000 to 5000, where the epoxy in said oligomer is a bisphenol epoxy; (2) about 1% to 10% by weight, of an acrylate-urethane oligomer; (3) about 10% to 94% by weight of reactive acrylate monomers from the group consisting of hydroxy propyl methacrylate, phenoxy ethyl acrylate, hexane diol diacrylate, and tetra ethylene glycol diacrylate; (4) from 0% to 10%, by weight, of UV photoinitiators; and (5) from 0% to 10%, by weight, of additives selected from adhesion promoters, pigments, dyes, flow control agents and their mixtures; with the proviso that photoinitiator be present in one or both components and that the total percentage weight, based on total composition weight, of said UV photoinitiators plus additives not be less than 1 percent and not exceed about 10 percent; where the viscosity is in the range of 200 cps. to 300 cps. at room temperature, and where the weight ratio of Component (A):Component (B) of from about 1:1 to about 1:2.

41. The composition according to claim 40 where polyisocyanate monomer is also added to the mixture of Component (A), where the composition has a viscosity in the range of 200 cps. to 300 cps. over an 8 hour period at room temperature, and were inhibitor in Component (A) is present in the range of from 0.01% to 0.1% by weight, based on Component (A), and where the composition is capable of U.V. cure in shadow areas hidden from a U.V. light source.

* * * * *